United States Patent
Yang

(10) Patent No.: US 9,906,221 B1
(45) Date of Patent: Feb. 27, 2018

(54) DRIVING CIRCUIT OF A POWER CIRCUIT

(71) Applicant: Delta Electronics, Inc., Taoyuan (TW)

(72) Inventor: Chang-Jing Yang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/395,738

(22) Filed: Dec. 30, 2016

(51) Int. Cl.
*H03L 5/00* (2006.01)
*H03K 17/16* (2006.01)
*H03K 17/687* (2006.01)
*H02M 3/07* (2006.01)
*H03K 3/3565* (2006.01)
*H01L 29/20* (2006.01)

(52) U.S. Cl.
CPC ..... *H03K 17/6871* (2013.01); *H01L 29/2003* (2013.01); *H02M 3/07* (2013.01); *H03K 3/3565* (2013.01)

(58) Field of Classification Search
CPC .... H03K 17/6871; H03K 3/3565; H02M 3/07
USPC ........................................ 327/109, 333, 536
See application file for complete search history.

(56) References Cited

U.S. PATENT DOCUMENTS

| | | | | |
|---|---|---|---|---|
| 6,885,225 B2 * | 4/2005 | Ohmichi | ............... | H02M 7/538 327/108 |
| 9,525,413 B2 * | 12/2016 | Roberts | ............ | H03K 17/04123 |
| 9,780,773 B2 * | 10/2017 | Kawata | ................. | H03K 17/16 |

* cited by examiner

*Primary Examiner* — Dinh T Le
(74) *Attorney, Agent, or Firm* — Muncy, Geissler, Olds & Lowe, P.C.

(57) ABSTRACT

A power circuit includes a power transistor flowing a power current to a ground according to the voltage of a driving node, a driving circuit, a first pre-driver, a second pre-driver, and a hysteresis circuit. The driving circuit includes a high-side transistor providing a supply voltage to the driving node according to a high-side voltage of a high-side node, a low-side transistor coupling the driving node to the ground according to a first internal signal, and a charge pump coupled to the high-side node and the driving node and generating the high-side voltage that exceeds the supply voltage according to the first internal signal. The first pre-driver receives a second internal signal to generate the first internal signal. The second pre-driver receives a third internal signal to generate the second internal signal. The hysteresis circuit receives a control signal to generate the third internal signal.

22 Claims, 7 Drawing Sheets

DRIVING CIRCUIT OF A POWER CIRCUIT

BACKGROUND OF THE INVENTION

Field of the Invention

The disclosure generally relates to a driving circuit integrated with a GaN power device.

Description of the Related Art

In a power circuit, a charge pump is always required to boost the supply voltage to a higher voltage for driving the power transistor. FIG. 1 illustrates a conventional power circuit. As shown in FIG. 1, the high-side driver DRV1 is configured to drive the first power transistor 110A, and the low-side driver DRV2 is configured to drive the second power transistor 110B. In addition, the boost capacitor CB and the boost diode DB are configured to boost the supply voltage VDD to the boost voltage VB, such that the first power transistor 110A can be fully turned on. Therefore, the first power transistor 110A supplied by the input voltage VIN and the second power transistor 110B can drive the load device RL through the inductor L and the capacitor C.

Since the inductor L may induce significant parasitic effects at the switch node SW (such as a negative voltage spike generated at the switch node SW by the turned-on body diode of the second power transistor 110B), these parasitic effects can interfered with the boost voltage VB when the boost capacitor CB is charged through the power transistor. Therefore, it is necessary to eliminate parasitic effects from the driving circuit.

BRIEF SUMMARY OF THE INVENTION

For solving the problems described above, the invention provides a driving circuit with a charge pump that is not charged through the power transistor to mitigate parasitic effects.

In an embodiment, a power circuit comprises a power transistor, a driving circuit, a first pre-driver, a second pre-driver, and a hysteresis circuit. The power transistor flows a power current to a ground according to a driving voltage of a driving node. The driving circuit comprises a high-side transistor, a low-side transistor, and a charge pump. The high-side transistor provides a supply voltage to the driving node according to a high-side voltage of a high-side node. The low-side transistor couples the driving node to the ground according to a first internal signal. The charge pump is coupled to the high-side node and the driving node, and is configured to generate the high-side voltage that exceeds the supply voltage according to the first internal signal. The first pre-driver receives a second internal signal to generate the first internal signal. The second pre-driver receives a third internal signal to generate the second internal signal. The hysteresis circuit receives a control signal to generate the third internal signal and is configured to provide a hysteresis for the control signal. The first pre-driver and the second pre-driver are configured to improve driving capability of the control signal.

According to an embodiment of the invention, the high-side transistor and the low-side transistor are normally-off transistors.

According to an embodiment of the invention, the power transistor is a GaN transistor.

According to an embodiment of the invention, the charge pump comprises a first unidirectional conducting device, a capacitor, a discharge resistor, a second unidirectional conducting device, a third unidirectional conducting device, and a switch. The first unidirectional conducting device unidirectionally provides the supply voltage to a first node. The capacitor is coupled between the first node and a second node. The discharge resistor is coupled between the first node and the high-side node. The second unidirectional conducting device unidirectionally couples the second node to the high-side node when the voltage of the second node exceeds the voltage of the high-side node. The third unidirectional conducting device unidirectionally provides the driving voltage to the second node when the driving voltage exceeds the voltage of the second node. The switch receives the control signal and is configured to couple the high-side node to the ground according to the control signal.

According to an embodiment of the invention, when the control signal is at a high voltage level, the switch is turned ON and the capacitor is charged by the supply voltage through the first unidirectional conducting device, the second unidirectional conducting device, and the switch. When the control signal is at a low voltage level, the switch is turned OFF, the third unidirectional conducting device provides the driving voltage to the second node, and the capacitor is discharged to the driving node through the discharge resistor.

According to an embodiment of the invention, each of the first unidirectional conducting device, the second unidirectional conducting device, and the third unidirectional conducting device is a diode or a diode-connected normally-off transistor.

According to an embodiment of the invention, the driving circuit further comprises a high-side normally-on transistor. The high-side normally-on transistor comprises a source terminal coupled to the driving node, a gate terminal coupled to the driving node, and a drain terminal supplied by the supply voltage. The high-side normally-on transistor is configured to improve the driving capability of the high-side transistor.

According to an embodiment of the invention, the first pre-driver comprises a first normally-on transistor and a first normally-off transistor. The first normally-on transistor comprises a gate terminal coupled to the driving circuit, a source terminal coupled to the driving circuit, and a drain terminal supplied by the supply voltage. The first normally-off transistor comprises a gate terminal receiving the control signal, a source terminal coupled to the ground, and a drain terminal coupled to the driving circuit.

According to another embodiment of the invention, the second pre-driver comprises a second normally-on transistor and a second normally-off transistor. The second normally-on transistor comprises a gate terminal coupled to the gate terminal of the first normally-off transistor, a source terminal coupled to the gate terminal of the first normally-off transistor, and a drain terminal supplied by the supply voltage. The second normally-off transistor comprises a gate tell sinal receiving the control signal, a source terminal coupled to the ground, and a drain terminal coupled to the gate terminal of the first normally-off transistor.

According to yet another embodiment of the invention, the hysteresis circuit comprises a first resistor, a third normally-off transistor, a fourth normally-off transistor, a fifth normally-off transistor, and a second resistor. The first resistor is coupled to the supply voltage. The third normally-off transistor comprises a gate terminal coupled to a third node, a source terminal coupled to a fourth node, and a drain terminal coupled to the first resistor. The fourth normally-off transistor comprises a gate terminal coupled to the third node, a source terminal coupled to the ground, and a drain terminal coupled to the fourth node. The fifth normally-off transistor comprises a gate terminal coupled to the first resistor, a source terminal coupled to the fourth node, and a drain terminal supplied by the supply voltage. The second resistor is coupled to the third node and receives the control signal.

In an embodiment, a driving circuit for driving a power transistor, which flows a power current to a ground according to a driving voltage of a driving node, comprises a high-side transistor, a low-side transistor, a charge pump, a first pre-driver, a second pre-driver, and a hysteresis circuit. The high-side transistor provides a supply voltage to the driving node according to a high-side voltage of a high-side node. The low-side transistor couples the driving node to the ground according to a first internal signal. The charge pump is coupled to the high-side node and the driving node, and is configured to generate the high-side voltage that exceeds the supply voltage according to the first internal signal. The first pre-driver receives a second internal signal to generate the first internal signal. The second pre-driver receives a third internal signal to generate the second internal signal. The hysteresis circuit receives a control signal to generate the third internal signal and is configured to provide a hysteresis function for the control signal. The first pre-driver and the second pre-driver are configured to improve driving capability of the control signal.

According to an embodiment of the invention, the high-side transistor and the low-side transistor are normally-off transistors.

According to an embodiment of the invention, the power transistor is a GaN transistor.

According to an embodiment of the invention, the charge pump comprises a first unidirectional conducting device, a capacitor, a discharge resistor, a second unidirectional conducting device, a third unidirectional conducting device, and a switch. The first unidirectional conducting device unidirectionally provides the supply voltage to a first node. The capacitor is coupled between the first node and a second node. The discharge resistor is coupled between the first node and the high-side node. The second unidirectional conducting device unidirectionally couples the second node to the high-side node when the voltage of the second node exceeds the voltage of the high-side node. The third unidirectional conducting device unidirectionally provides the driving voltage to the second node when the driving voltage exceeds the voltage of the second node. The switch receives the control signal and is configured to couple the high-side node to the ground according to the control signal.

According to an embodiment of the invention, when the control signal is at a high voltage level, the switch is turned ON and the capacitor is charged by the supply voltage through the first unidirectional conducting device, the second unidirectional conducting device, and the switch. When the control signal is at a low voltage level, the switch is turned OFF, the third unidirectional conducting device provides the driving voltage to the second node, and the capacitor is discharged to the driving node through the discharge resistor.

According to an embodiment of the invention, each of the first unidirectional conducting device, the second unidirectional conducting device, and the third unidirectional conducting device is a diode or a diode-connected normally-off transistor.

According to an embodiment of the invention, the driving circuit further comprises a high-side normally-on transistor. The high-side normally-on transistor comprises a source terminal coupled to the driving node, a gate terminal coupled to the driving node, and a drain terminal supplied by the supply voltage. The high-side normally-on transistor is configured to improve the driving capability of the high-side transistor.

According to an embodiment of the invention, the first pre-driver comprises a first normally-on transistor and a first normally-off transistor. The first normally-on transistor comprises a gate terminal coupled to the driving circuit, a source terminal coupled to the driving circuit, and a drain terminal supplied by the supply voltage. The first normally-off transistor comprises a gate terminal receiving the control signal, a source terminal coupled to the ground, and a drain terminal coupled to the driving circuit.

According to another embodiment of the invention, the second pre-driver comprises a second normally-on transistor and a second normally-off transistor. The second normally-on transistor comprises a gate terminal coupled to the gate terminal of the first normally-off transistor, a source terminal coupled to the gate terminal of the first normally-off transistor, and a drain terminal supplied by the supply voltage. The second normally-off transistor comprises a gate terminal receiving the control signal, a source terminal coupled to the ground, and a drain terminal coupled to the gate terminal of the first normally-off transistor.

According to yet another embodiment of the invention, the hysteresis circuit comprises a first resistor, a third normally-off transistor, a fourth normally-off transistor, a fifth normally-off transistor, and a second resistor. The first resistor is coupled to the supply voltage. The third normally-off transistor comprises a gate terminal coupled to a third node, a source terminal coupled to a fourth node, and a drain terminal coupled to the first resistor. The fourth normally-off transistor comprises a gate terminal coupled to the third node, a source terminal coupled to the ground, and a drain terminal coupled to the fourth node. The fifth normally-off transistor comprises a gate terminal coupled to the first resistor, a source terminal coupled to the fourth node, and a drain terminal supplied by the supply voltage. The second resistor is coupled to the third node and receives the control signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
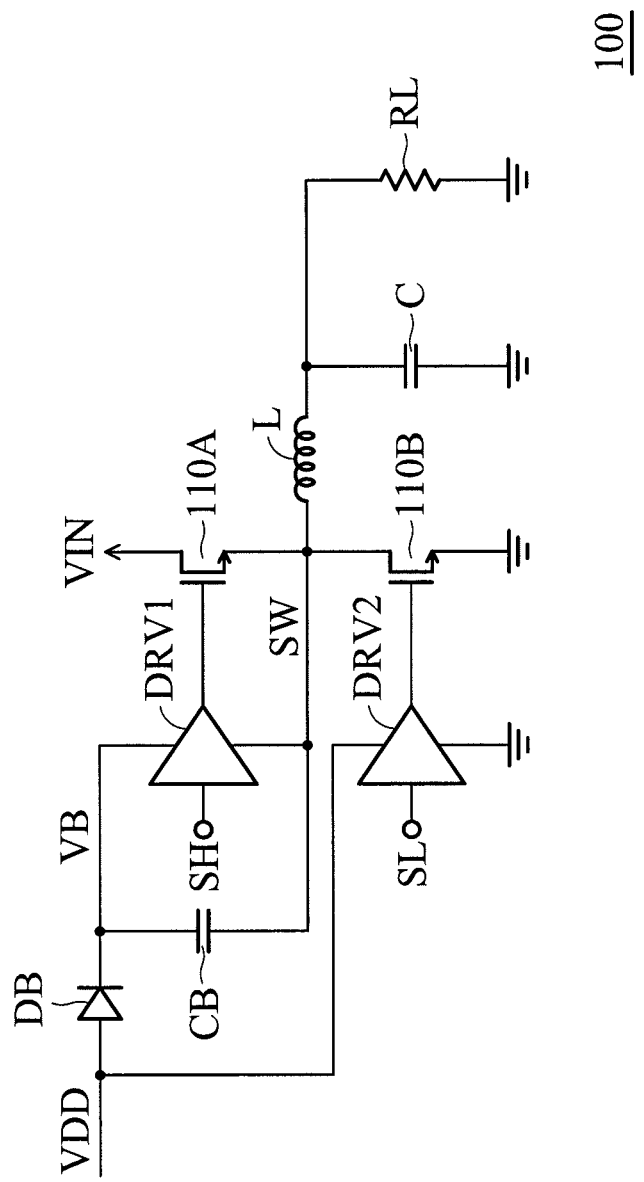
FIG. 1 illustrates a conventional power circuit.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 2:
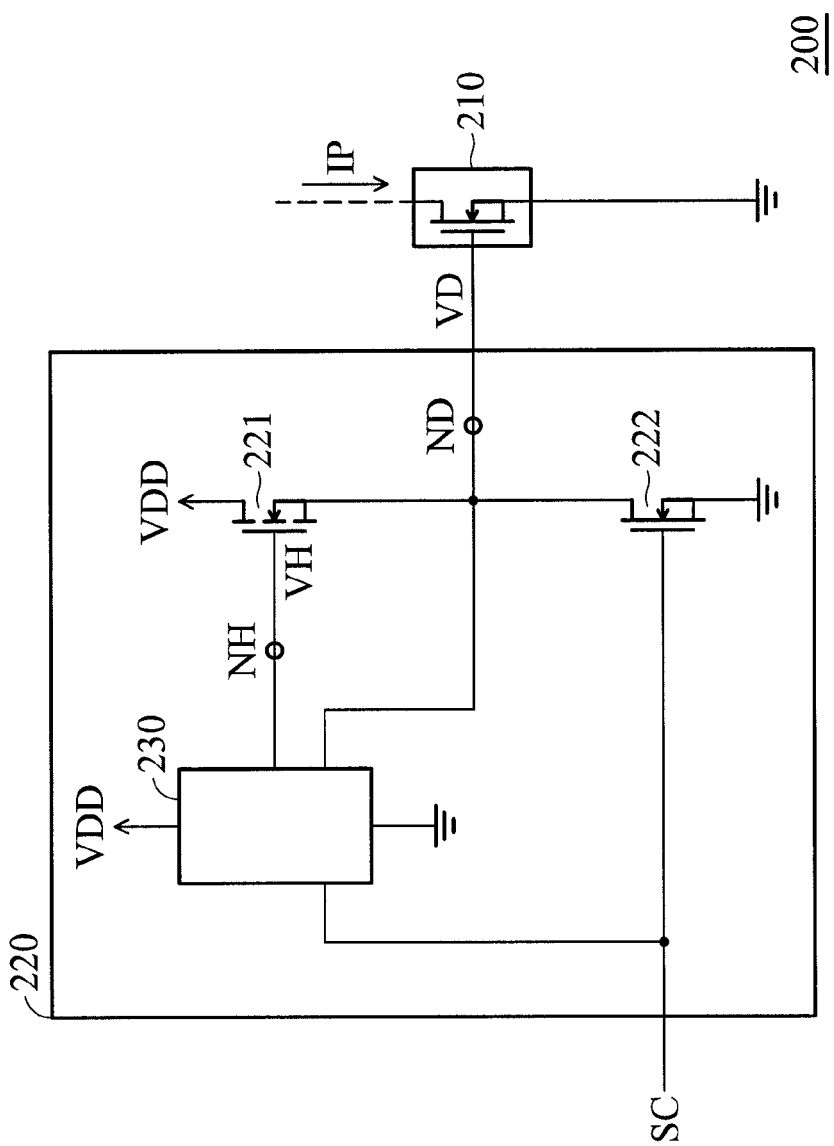
FIG. 2 is a block diagram of a power circuit in accordance with an embodiment of the invention.

FIG. 2 is a block diagram of a power circuit in accordance with an embodiment of the invention. As shown in FIG. 2, the power circuit 200 includes a power transistor 210 and a driving circuit 220. The power transistor 210 flows the power current IP to the ground according to the driving voltage VD of the driving node ND. According to an embodiment of the invention, the power transistor 210 is a GaN transistor.

The driving circuit 220 includes a high-side transistor 221, a low-side transistor 222, and a charge pump 230. The high-side transistor 221 supplies the supply voltage VDD to the driving node ND according to the high-side voltage VH of the high-side node NH. The low-side transistor 222 is coupled between the driving node ND and the ground, and configured to pull the driving voltage VD down to the ground according to the control signal SC. According to an embodiment of the invention, the high-side transistor 221 and the low-side transistor 222 are normally-off transistors.

The charge pump 230 is supplied by the supply voltage VDD and the ground and coupled to the high-side node NH and the driving node ND. For the sake of fully turning on the high-side transistor 221, the charge pump 230 is configured to generate the high-side voltage VH exceeding the supply voltage VDD, such that the gate-to-source voltage of the high-side transistor 221 at least exceeds the threshold voltage to apply the supply voltage VDD to the driving node ND. According to an embodiment of the invention, the driving driving circuit 220 is a rail-to-rail driver, such that the driving voltage VD ranges from the supply voltage VDD to the ground level.

Figure 3:
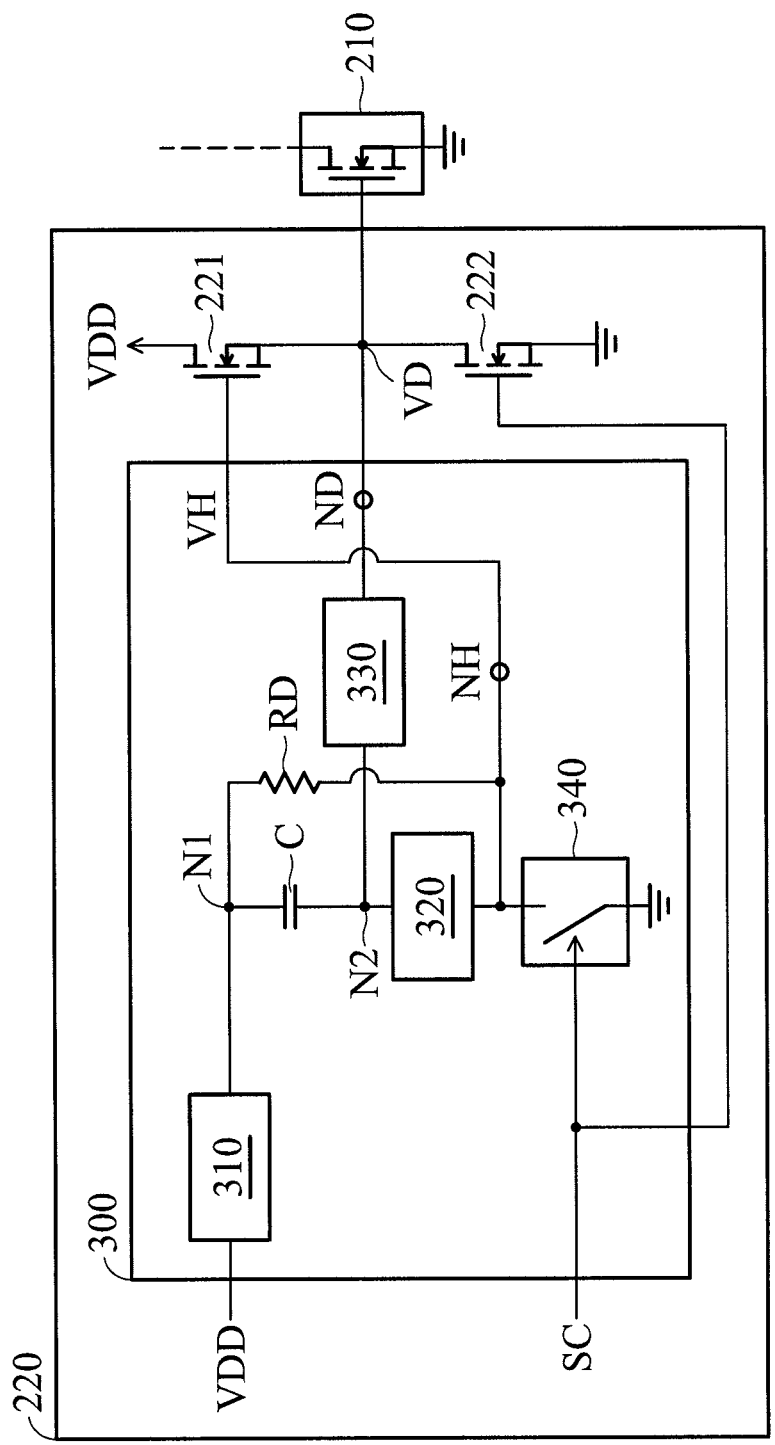
FIG. 3 shows a schematic diagram of the charge pump in the power circuit 200 of FIG. 2 in accordance with the invention.

FIG. 3 shows a schematic diagram of the charge pump in the power circuit 200 of FIG. 2 in accordance with the invention. As shown in FIG. 3, the charge pump 300, which is coupled to the driving node ND and the high-side node NH, includes a first unidirectional conducting device 310, a discharge resistor RD, a capacitor C, a second unidirectional conducting device 320, a third unidirectional conducting device 330, and a switch 340.

When the supply voltage VDD exceeds the voltage of the first node N1, the first unidirectional conducting device 310 is turned ON. When the voltage VDD does not exceed the voltage of the first node N1, the first unidirectional conducting device 310 is turned OFF. The capacitor C is coupled between the first node N1 and the second node N2. The discharge resistor RD is coupled between the first node N1 and the high-side node NH.

The second unidirectional conducting device 320 is coupled between the second node N2 and the high-side node NH. When the voltage of the second node N2 exceeds the high-side voltage VH, the second unidirectional conducting device 320 is turned ON. When the voltage of the second node N2 does not exceed the high-side voltage VH, the second unidirectional conducting device 320 is turned OFF.

The third unidirectional conducting device 330 is coupled between the driving node ND and the second node N2. When the driving voltage VD of the driving node ND exceeds the voltage of the second node N2, the third unidirectional conducting device 330 is turned ON. When the driving voltage VD does not exceed the voltage of the second node N2, the third unidirectional conducting device 330 is turned OFF.

The switch 340 receives the control signal SC and is coupled between the high-side node NH and the ground. In addition, the switch 340 is configured to couple the high-side node NH to the ground according to the control signal SC.

For the simplicity of illustration, the switch 340 is illustrated herein as an N-type transistor. According to an embodiment of the invention, when the control signal SC is at the high voltage level, such as the supply voltage VDD, the switch 340 is turned ON and the capacitor C is charged by the supply voltage VDD through the first unidirectional conducting device 310, the second unidirectional conducting device 320, and the switch 340 to the ground.

According to another embodiment of the invention, when the control signal SC is at the low voltage level, such as the ground level, the switch 340 is turned OFF and the third unidirectional conducting device 330 provides the driving voltage VD to the second node N2, such that the capacitor C is discharged to the driving node ND through the discharge resistor RD.

According to an embodiment of the invention, the resistance of the discharge resistor RD determines the maximum voltage that the capacitor C can be charged and also the maximum voltage that the high-side voltage VH can be achieved. In addition, the larger the resistance of the discharge resistor RD is, the lower the rising speed of the high-side voltage VD could be achieved. Therefore, there is a trade-off on the resistance of the discharge resistor RD.

According to an embodiment of the invention, each of the first unidirectional conducting device 310, the second unidirectional conducting device 320, and the third unidirectional conducting device 330 is a diode. According to another embodiment of the invention, each of the first unidirectional conducting device 310, the second unidirectional conducting device 320, and the third unidirectional conducting device 330 is a diode-connected normally-off transistor.

Figure 4:
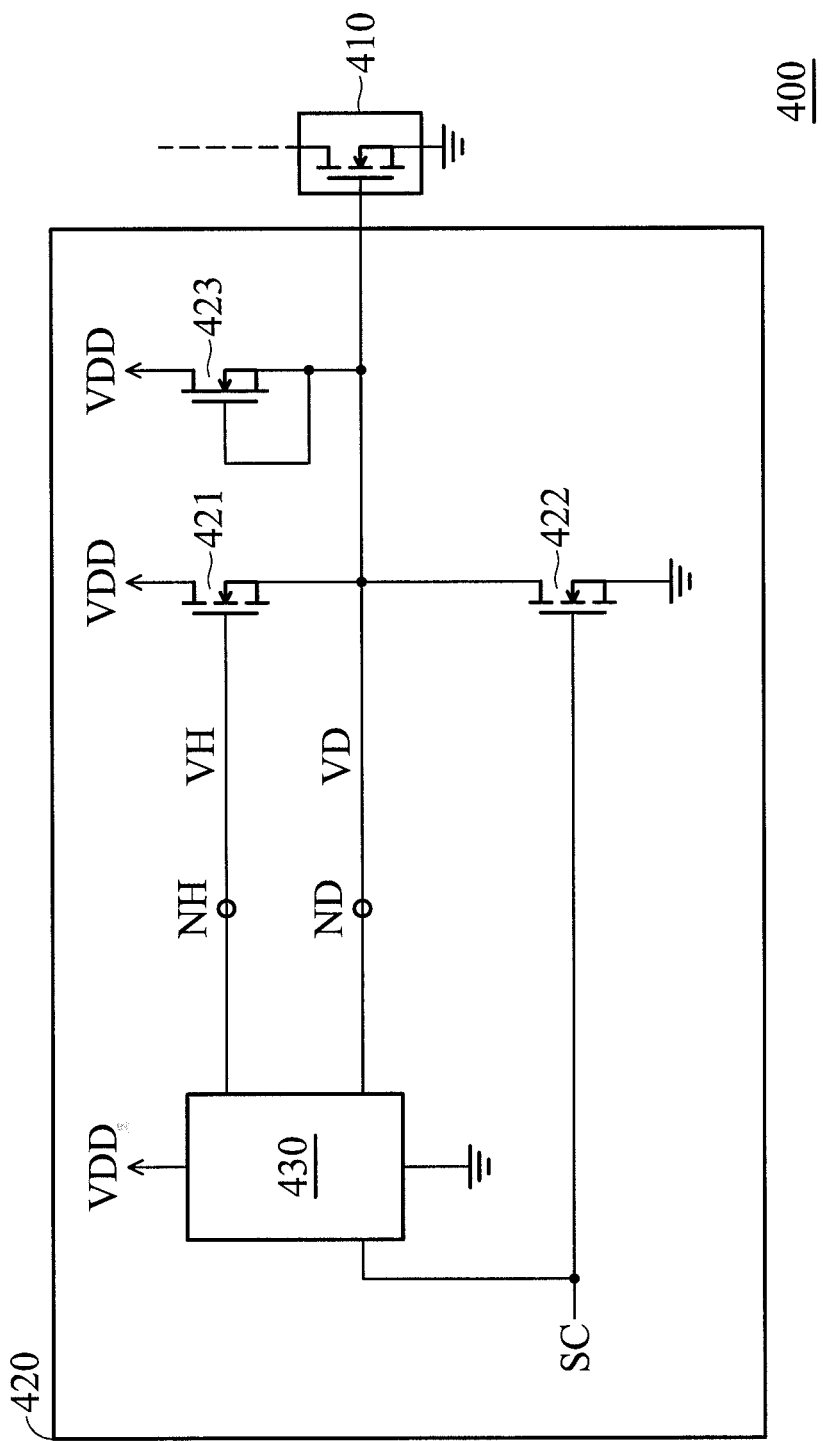
FIG. 4 shows a block diagram of a power circuit in accordance with another embodiment of the invention.

FIG. 4 shows a block diagram of a power circuit in accordance with another embodiment of the invention. As shown in FIG. 4, the power circuit 400 includes a power transistor 410 and a driving circuit 420, in which the power transistor 410 and the driving circuit 420 respectively correspond to the power transistor 210 and the driving circuit 220 in FIG. 2.

The driving circuit 420 further includes a high-side normally-on transistor 423. The source terminal and the gate terminal of the high-side normally-on transistor 423 are coupled to the driving node ND, and the drain terminal of the high-side normally-on transistor 423 is supplied by the supply voltage VDD. The high-side normally-on transistor 423 is always turned on to improve the driving capability of the high-side transistor 421.

Figure 5:
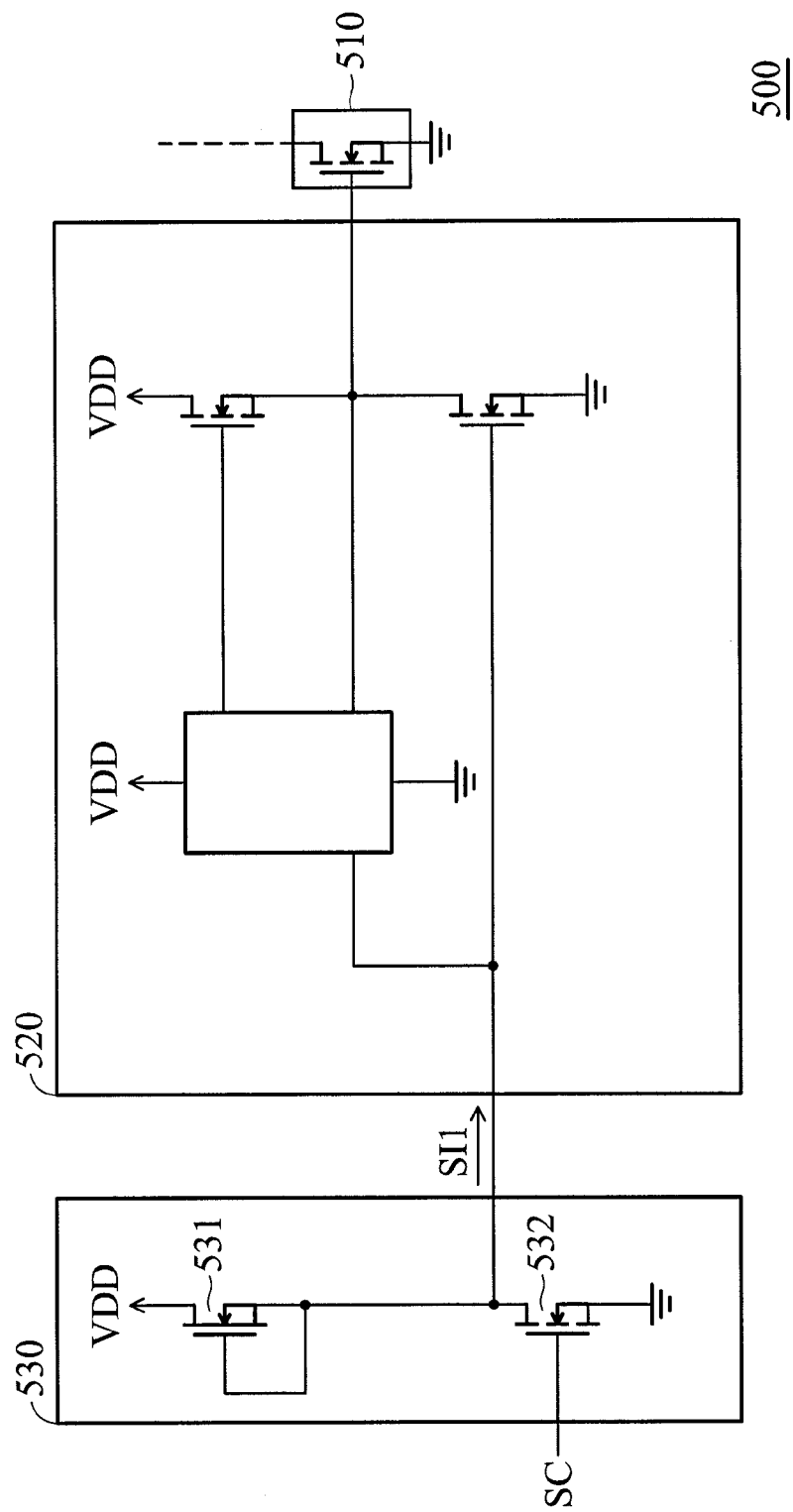
FIG. 5 shows a block diagram of a power circuit in accordance with yet another embodiment of the invention.

FIG. 5 shows a block diagram of a power circuit in accordance with yet another embodiment of the invention. As shown in FIG. 5, the power circuit 500 includes a power transistor 510, a driving circuit 520, and a first pre-driver 530, in which the power transistor 510 and the driving circuit 520 respectively correspond to the power transistor 210 and the driving circuit 220 in FIG. 2.

The first pre-driver 530 receives the control signal SC to generate the first internal signal SI1 to the driving circuit 520 for improving the driving capability of the control signal SC. The first pre-driver 530 includes a first normally-on transistor 531 and a first normally-off transistor 532.

The gate terminal and the source terminal of the first normally-on transistor 531 are coupled to the driving circuit 520, and the drain terminal of the first normally-on transistor 531 is supplied by the supply voltage VDD. The gate terminal of first normally-off transistor 532 receives the control signal SC, the source terminal of first normally-off transistor 532 is coupled to the ground, and the drain terminal of first normally-off transistor 532 is coupled to the driving circuit 520.

Figure 6:
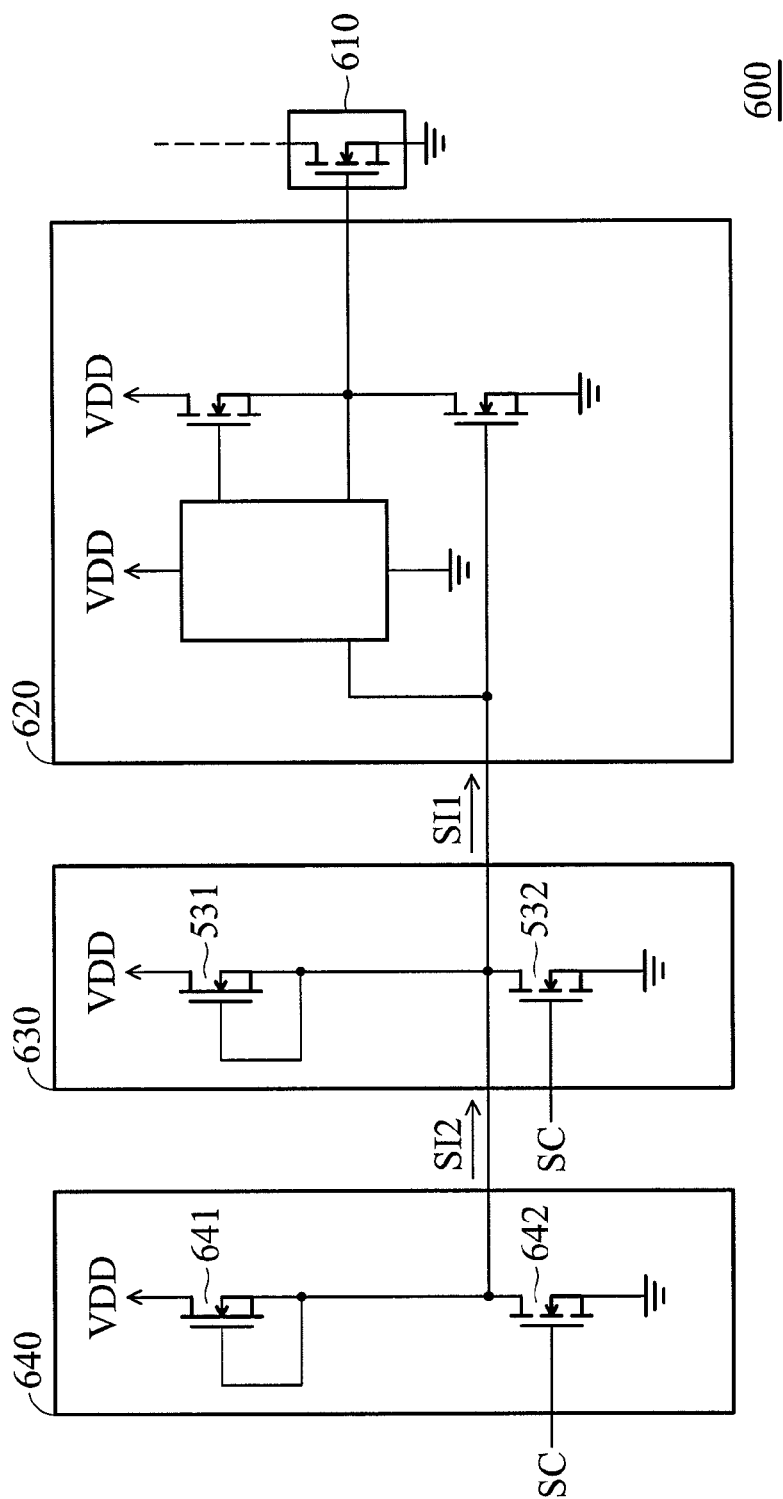
FIG. 6 shows a block diagram of a power circuit in accordance with yet another embodiment of the invention.

FIG. 6 shows a block diagram of a power circuit in accordance with yet another embodiment of the invention. As shown in FIG. 6, the power circuit 600 includes a power transistor 610, a driving circuit 620, a first pre-driver 630, and a second pre-driver 640, in which the power transistor 610, the driving circuit 620, and the first pre-driver 630 respectively correspond to the power transistor 510, the driving circuit 520, and the first pre-driver 530 in FIG. 5.

The second pre-driver 640 receives the control signal SC to generate the second internal signal SI2 to the first pre-driver 630 for further improving the driving capability of the control signal SC. The second pre-driver 640 includes a second normally-on transistor 641 and a second normally-off transistor 642.

The gate terminal and the source terminal of the second normally-on transistor 641 are coupled to the first pre-driver 630, and the drain terminal of the second normally-on transistor 641 is supplied by the supply voltage VDD. The gate terminal of the second normally-off transistor 642 receives the control signal SC, the source terminal of the second normally-off transistor 642 is coupled to the ground, and the drain terminal is coupled to the first pre-driver 630.

Figure 7:
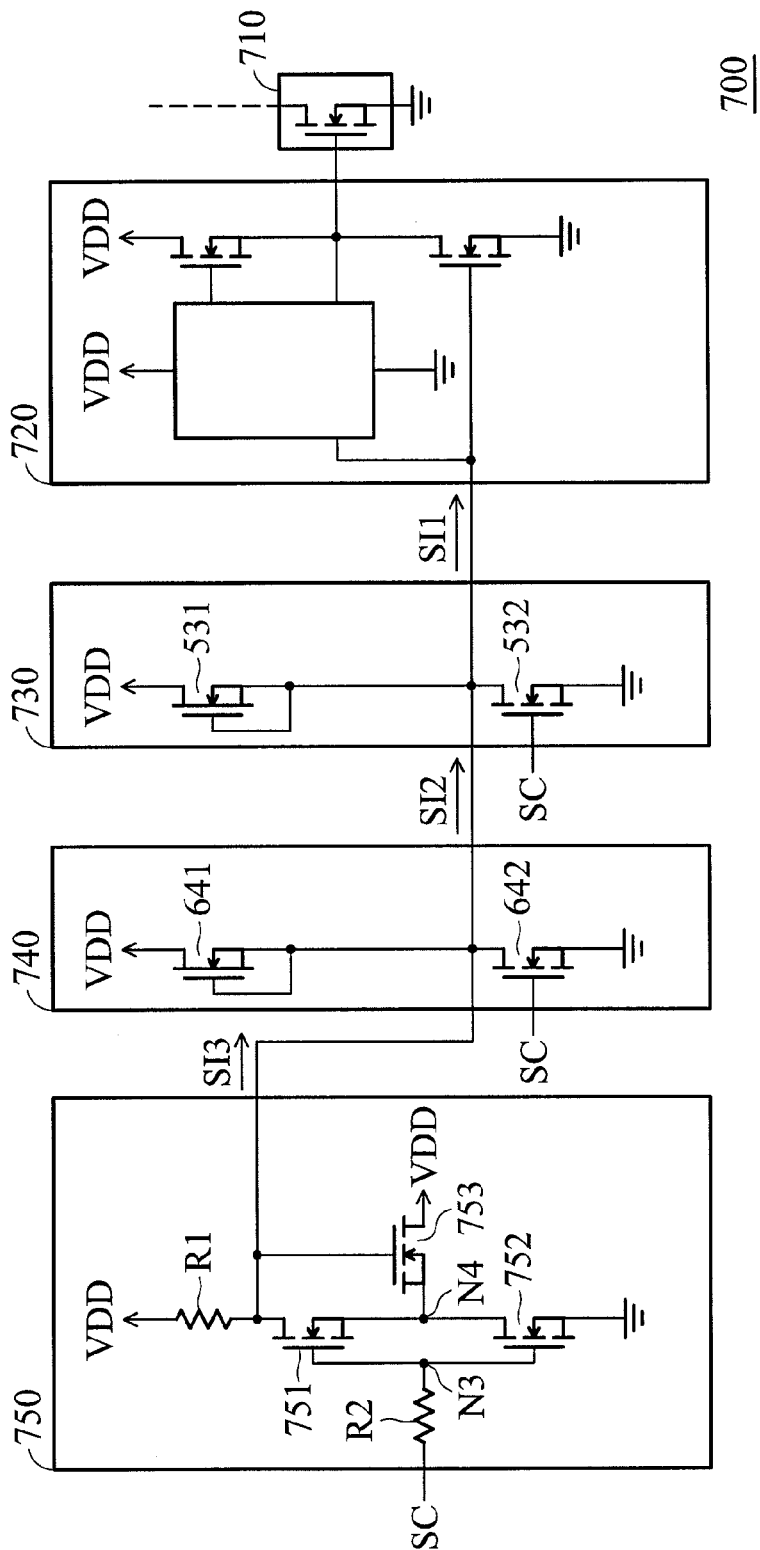
FIG. 7 shows a block diagram of a power circuit in accordance with yet another embodiment of the invention.
Figure 6:
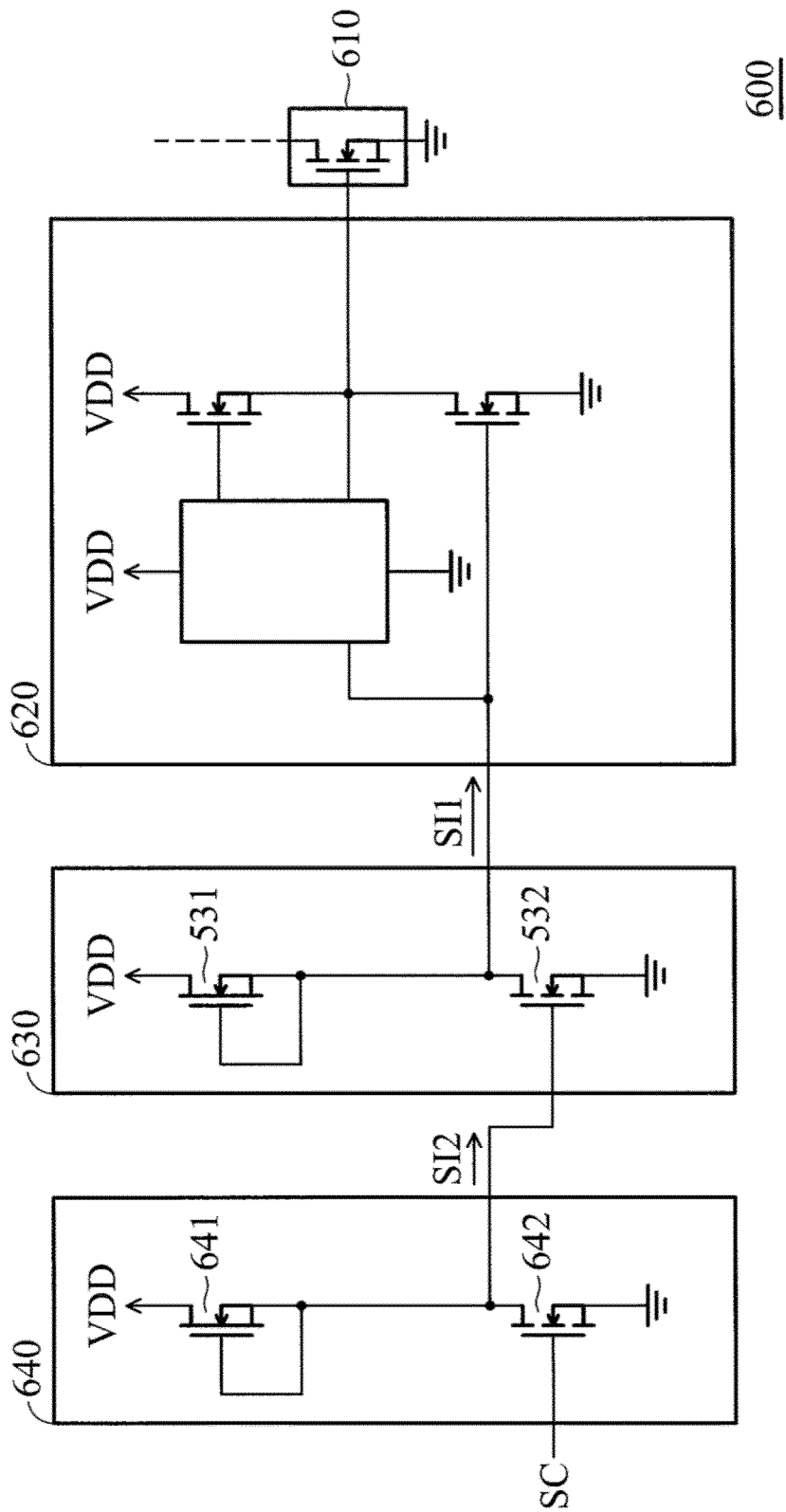
Figure 7:
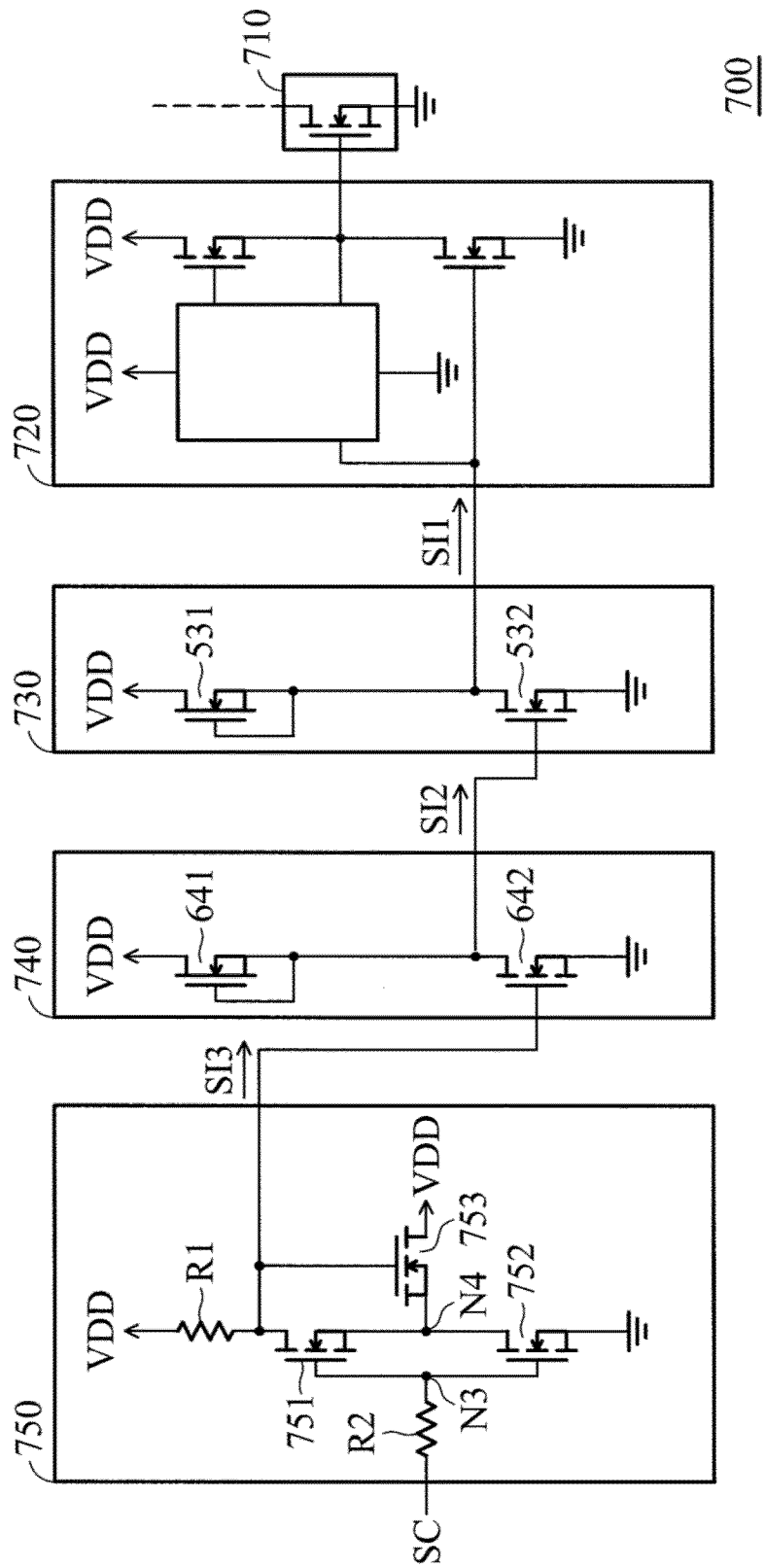

FIG. 7 shows a block diagram of a power circuit in accordance with yet another embodiment of the invention. As shown in FIG. 7, the power circuit 700 includes a power transistor 710, a driving circuit 720, a first pre-driver 730, a second pre-driver 740, and a hysteresis circuit 750, in which the power transistor 710, the driving circuit 720, the first pre-driver 730, and the second pre-driver 740 respectively correspond to the power transistor 610, the driving circuit 620, the first pre-driver 630, and the second pre-driver 640 in FIG. 6.

The hysteresis circuit 750 receives the control signal SC to generate the third internal signal SI3 to the second pre-driver 740 for further providing a hysteresis for the control signal SC. The hysteresis circuit 750 includes a first resistor R1, a third normally-off transistor 751, a fourth normally-off transistor 752, a fifth normally-off transistor 753, and a second resistor R2.

The first resistor is coupled to the supply voltage VDD. The gate terminal of the third normally-off transistor 751 is coupled to a third node N3, the source terminal of the third normally-off transistor 751 is coupled to the fourth node N4, and the drain terminal of the third normally-off transistor 751 is coupled to the first resistor R1. The gate terminal of the fourth normally-off transistor 752 is coupled to the third node N3, the source terminal of the fourth normally-off transistor 752 is coupled to the ground, and the drain terminal of the fourth normally-off transistor 752 is coupled to the fourth node N4.

The gate terminal of the fifth normally-off transistor 753 is coupled to the first resistor R1, the source terminal of the fifth normally-off transistor 753 is coupled to the fourth node N4, and the drain terminal of the fifth normally-off transistor 753 is supplied by the supply voltage VDD. The second resistor R2 is coupled to the third node and receives the control signal SC.

Since the capacitor of the charge pump is not charged through the power transistor, the high-side voltage VH can be kept steady and protected from interference.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

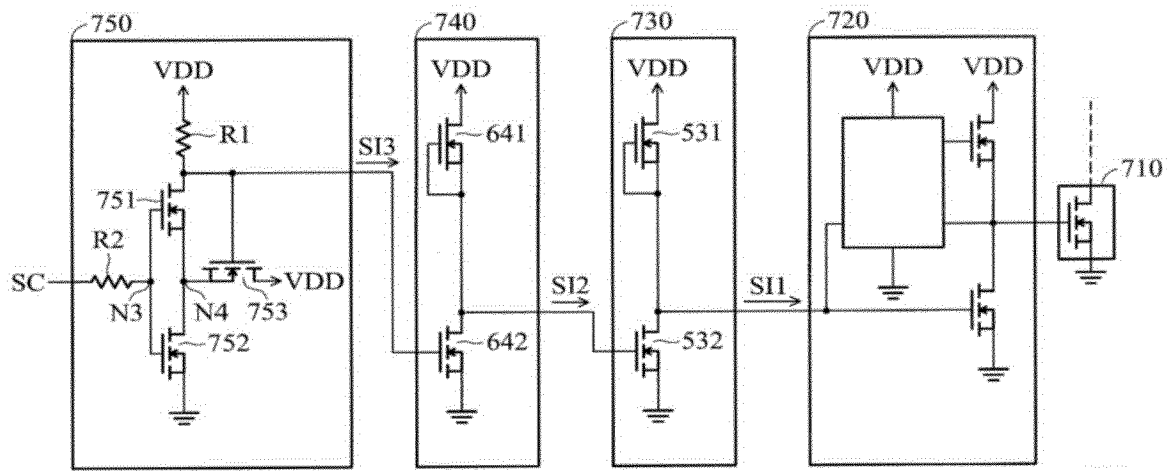

What is claimed is:
1. A power circuit, comprising:
   a power transistor, flowing a power current to a ground according to a driving voltage of a driving node; and
   a driving circuit, comprising:
      a high-side transistor, providing a supply voltage to the driving node according to a high-side voltage of a high-side node;
      a low-side transistor, coupling the driving node to the ground according to a first internal signal; and
      a charge pump, coupled to the high-side node and the driving node, wherein the charge pump is configured to generate a high-side voltage that exceeds the supply voltage according to the first internal signal;
   a first pre-driver, receiving a second internal signal to generate the first internal signal;
   a second pre-driver, receiving a third internal signal to generate the second internal signal; and
   a hysteresis circuit, receiving a control signal to generate the third internal signal and configured to provide a hysteresis for the control signal, wherein the first pre-driver and the second pre-driver are configured to improve driving capability of the control signal.

2. The power circuit of claim 1, wherein the high-side transistor and the low-side transistor are normally-off transistors.

3. The power circuit of claim 1, wherein the power transistor is a GaN transistor.

4. The power circuit of claim 1, wherein the charge pump comprises:
   a first unidirectional conducting device, unidirectionally providing the supply voltage to a first node;
   a capacitor, coupled between the first node and a second node;
   a discharge resistor, coupled between the first node and the high-side node;
   a second unidirectional conducting device, unidirectionally coupling the second node to the high-side node when a voltage of the second node exceeds a voltage of the high-side node;

a third unidirectional conducting device, unidirectionally providing the driving voltage to the second node when the driving voltage exceeds the voltage of the second node; and a switch, receiving the control signal and configured to couple the high-side node to the ground according to the control signal.

5. The power circuit of claim 4, wherein, when the control signal is at a high voltage level, the switch is turned ON and the capacitor is charged by the supply voltage through the first unidirectional conducting device, the second unidirectional conducting device, and the switch, wherein, when the control signal is at a low voltage level, the switch is turned OFF, the third unidirectional conducting device provides the driving voltage to the second node, and the capacitor is discharged to the driving node through the discharge resistor.

6. The power circuit of claim 4, wherein each of the first unidirectional conducting device, the second unidirectional conducting device, and the third unidirectional conducting device is a diode or a diode-connected normally-off transistor.

7. The power circuit of claim 1, wherein the driving circuit further comprises:

a high-side normally-on transistor, comprising a source terminal coupled to the driving node, a gate terminal coupled to the driving node, and a drain terminal supplied by the supply voltage, wherein the high-side normally-on transistor is configured to improve driving capability of the high-side transistor.

8. The power circuit of claim 1, wherein the first pre-driver comprises:

a first normally-on transistor, comprising a gate terminal coupled to the driving circuit, a source terminal coupled to the driving circuit, and a drain terminal supplied by the supply voltage; and a first normally-off transistor, comprising a gate terminal receiving the control signal, a source terminal coupled to the ground, and a drain terminal coupled to the driving circuit.

9. The power circuit of claim 8, wherein the second pre-driver comprises:

a second normally-on transistor, comprising a gate terminal coupled to the gate terminal of the first normally-off transistor, a source terminal coupled to the gate terminal of the first normally-off transistor, and a drain terminal supplied by the supply voltage; and a second normally-off transistor, comprising a gate terminal receiving the control signal, a source terminal coupled to the ground, and a drain terminal coupled to the gate terminal of the first normally-off transistor.

10. The power circuit of claim 9, wherein the hysteresis circuit comprises:

a first resistor, coupled to the supply voltage;

a third normally-off transistor, comprising a gate terminal coupled to a third node, a source terminal coupled to a fourth node, and a drain terminal coupled to the first resistor;

a fourth normally-off transistor, comprising a gate terminal coupled to the third node, a source terminal coupled to the ground, and a drain terminal coupled to the fourth node;

a fifth normally-off transistor, comprising a gate terminal coupled to the first resistor, a source terminal coupled to the fourth node, and a drain terminal supplied by the supply voltage; and a second resistor, coupled to the third node and receiving the control signal.

11. The power circuit of claim 1, wherein the driving circuit is a rail-to-rail driver, such that the driving voltage ranges from the supply voltage to the ground.

12. A driving circuit for driving a power transistor, wherein the power transistor flows a power current to a ground according to a driving voltage of a driving node, the driving circuit comprising:

a high-side transistor, providing a supply voltage to the driving node according to a high-side voltage of a high-side node;

a low-side transistor, coupling the driving node to the ground according to a first internal signal; and a charge pump, coupled to the high-side node and the driving node, wherein the charge pump is configured to generate a high-side voltage that exceeds the supply voltage according to the first internal signal;

a first pre-driver, receiving a second internal signal to generate the first internal signal;

a second pre-driver, receiving a third internal signal to generate the second internal signal; and a hysteresis circuit, receiving a control signal to generate the third internal signal and configured to provide a hysteresis function for the control signal, wherein the first pre-driver and the second pre-driver are configured to improve driving capability of the control signal.

13. The driving circuit of claim 12, wherein the high-side transistor and the low-side transistor are normally-off transistors.

14. The driving circuit of claim 12, wherein the power transistor is a GaN transistor.

15. The driving circuit of claim 12, wherein the charge pump comprises:

a first unidirectional conducting device, unidirectionally providing the supply voltage to a first node;

a capacitor, coupled between the first node and a second node;

a discharge resistor, coupled between the first node and the high-side node;

a second unidirectional conducting device, unidirectionally coupling the second node to the high-side node when a voltage of the second node exceeds a voltage of the high-side node;

a third unidirectional conducting device, unidirectionally providing the driving voltage to the second node when the driving voltage exceeds the voltage of the second node; and a switch, receiving the control signal and configured to couple the high-side node to the ground according to the control signal.

16. The driving circuit of claim 15, wherein, when the control signal is at a high voltage level, the switch is turned ON and the capacitor is charged by the supply voltage through the first unidirectional conducting device, the second unidirectional conducting device, and the switch, wherein, when the control signal is at a low voltage level, the switch is turned OFF, the third unidirectional conducting device provides the driving voltage to the second node, and the capacitor is discharged to the driving node through the discharge resistor.

17. The driving circuit of claim 15, wherein each of the first unidirectional conducting device, the second unidirectional conducting device, and the third unidirectional conducting device is a diode or a diode-connected normally-off transistor.

18. The driving circuit of claim 12, further comprising:
a high-side normally-on transistor, comprising a source terminal coupled to the driving node, a gate terminal coupled to the driving node, and a drain terminal supplied by the supply voltage, wherein the high-side normally-on transistor is configured to improve driving capability of the high-side transistor.

19. The driving circuit of claim 18, wherein the first pre-driver comprises:
a first normally-on transistor, comprising a gate terminal coupled to the driving circuit, a source terminal coupled to the driving circuit, and a drain terminal supplied by the supply voltage; and
a first normally-off transistor, comprising a gate terminal receiving the control signal, a source terminal coupled to the ground, and a drain terminal coupled to the driving circuit.

20. The driving circuit of claim 19, wherein the second pre-driver comprises:
a second normally-on transistor, comprising a gate terminal coupled to the gate terminal of the first normally-off transistor, a source terminal coupled to the gate terminal of the first normally-off transistor, and a drain terminal supplied by the supply voltage; and
a second normally-off transistor, comprising a gate terminal receiving the control signal, a source terminal coupled to the ground, and a drain terminal coupled to the gate terminal of the first normally-off transistor.

21. The driving circuit of claim 20, wherein the hysteresis circuit comprises:
a first resistor, coupled to the supply voltage;
a third normally-off transistor, comprising a gate terminal coupled to a third node, a source terminal coupled to a fourth node, and a drain terminal coupled to the first resistor;
a fourth normally-off transistor, comprising a gate terminal coupled to the third node, a source terminal coupled to the ground, and a drain terminal coupled to the fourth node;
a fifth normally-off transistor, comprising a gate terminal coupled to the first resistor, a source terminal coupled to the fourth node, and a drain terminal supplied by the supply voltage; and
a second resistor, coupled to the third node and receiving the control signal.

22. The driving circuit of claim 12, wherein the driving circuit is a rail-to-rail driver, such that the driving voltage ranges from the supply voltage to the ground.

* * * * *

UNITED STATES PATENT AND TRADEMARK OFFICE
CERTIFICATE OF CORRECTION

PATENT NO.          : 9,906,221 B1
APPLICATION NO.     : 15/395738
DATED               : February 27, 2018
INVENTOR(S)         : Chang-Jing Yang It is certified that error appears in the above-identified patent and that said Letters Patent is hereby corrected as shown below:

On the Title Page

Delete the title page and substitute therefore with the attached title page consisting of the corrected illustrative figure.

In the Drawings

Please replace FIGS. 6 and 7 with FIGS. 6 and 7 as shown on the attached pages.

Signed and Sealed this
Nineteenth Day of March, 2019

Andrei Iancu
*Director of the United States Patent and Trademark Office*

(12) United States Patent
Yang

(10) Patent No.: US 9,906,221 B1
(45) Date of Patent: Feb. 27, 2018

(54) DRIVING CIRCUIT OF A POWER CIRCUIT

(71) Applicant: Delta Electronics, Inc., Taoyuan (TW)

(72) Inventor: Chang-Jing Yang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/395,738

(22) Filed: Dec. 30, 2016

(51) Int. Cl.
  *H03L 5/00* (2006.01)
  *H03K 17/16* (2006.01)
  *H03K 17/687* (2006.01)
  *H02M 3/07* (2006.01)
  *H03K 3/3565* (2006.01)
  *H01L 29/20* (2006.01)

(52) U.S. Cl.
  CPC ..... *H03K 17/6871* (2013.01); *H01L 29/2003* (2013.01); *H02M 3/07* (2013.01); *H03K 3/3565* (2013.01)

(58) Field of Classification Search
  CPC .... H03K 17/6871; H03K 3/3565; H02M 3/07
  USPC ........................................ 327/109, 333, 536
  See application file for complete search history.

(56) References Cited

U.S. PATENT DOCUMENTS

| | | | |
|---|---|---|---|
| 6,885,225 B2* | 4/2005 | Ohmichi | H02M 7/538 327/108 |
| 9,525,413 B2* | 12/2016 | Roberts | H03K 17/04123 |
| 9,780,773 B2* | 10/2017 | Kawata | H03K 17/16 |

* cited by examiner

*Primary Examiner* — Dinh T Le
(74) *Attorney, Agent, or Firm* — Muncy, Geissler, Olds & Lowe, P.C.

(57) ABSTRACT

A power circuit includes a power transistor flowing a power current to a ground according to the voltage of a driving node, a driving circuit, a first pre-driver, a second pre-driver, and a hysteresis circuit. The driving circuit includes a high-side transistor providing a supply voltage to the driving node according to a high-side voltage of a high-side node, a low-side transistor coupling the driving node to the ground according to a first internal signal, and a charge pump coupled to the high-side node and the driving node and generating the high-side voltage that exceeds the supply voltage according to the first internal signal. The first pre-driver receives a second internal signal to generate the first internal signal. The second pre-driver receives a third internal signal to generate the second internal signal. The hysteresis circuit receives a control signal to generate the third internal signal.

22 Claims, 7 Drawing Sheets